United States Patent
Alstad (10) Patent No.: US 10,954,814 B2
(45) Date of Patent: Mar. 23, 2021

(54) SYSTEM WITH THIN WALLED COOLING PLATE FOR AN ELECTRONIC ENCLOSURE

(71) Applicant: HONEYWELL INTERNATIONAL INC., Morris Plains, NJ (US)

(72) Inventor: Shawn Alstad, Phoenix, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 182 days.

(21) Appl. No.: 16/142,420

(22) Filed: Sep. 26, 2018

(65) Prior Publication Data

US 2020/0095888 A1   Mar. 26, 2020

(51) Int. Cl.

| | | |
|---|---|---|
| *F02C 7/22* | (2006.01) | |
| *F01D 25/12* | (2006.01) | |
| *F02C 7/16* | (2006.01) | |
| *F02C 9/26* | (2006.01) | |
| *F28F 13/18* | (2006.01) | |
| *H05K 7/20* | (2006.01) | |

(Continued)

(52) U.S. Cl.
CPC .............. *F01D 25/12* (2013.01); *F02C 7/16* (2013.01); *F02C 7/224* (2013.01); *F02C 9/263* (2013.01); *F28F 13/18* (2013.01); *H05K 7/20254* (2013.01); *H05K 7/20272* (2013.01); *H05K 7/20872* (2013.01); *B64D 27/10* (2013.01); *F05D 2220/32* (2013.01); *F05D 2260/205* (2013.01); *F05D 2270/00* (2013.01)

(58) Field of Classification Search
CPC ........... H05K 7/20218; H05K 7/20254; H05K 7/20872; H05K 7/20927; F02C 7/22–224
See application file for complete search history.

(56) References Cited

U.S. PATENT DOCUMENTS 6,302,190 B1 * 10/2001 Clamp .................. F28F 3/12
                                                  165/80.4
6,396,692 B1    5/2002 Farshi et al.
(Continued)

FOREIGN PATENT DOCUMENTS

DE   102011101302 A1   11/2012
EP       2413681 A2    2/2012
(Continued)

OTHER PUBLICATIONS

Ebay listing entitled "Cummins ECM Cooling Plate w/Fuel Pump 4997021 P5260632 4997186," eBay item No. 253270728066, 2 pages, posted May 14, 2018 by user "taatatta". Retrieved from Internet: www.ebay.com on Sep. 25, 2018.

*Primary Examiner* — Gerald L Sung
*Assistant Examiner* — Rene D Ford
(74) *Attorney, Agent, or Firm* — Lorenz & Kopf, LLP (57) ABSTRACT

A cooling system with a thin walled cooling plate. The system includes an enclosure with a cover that defines an interior space and that has an open side. Temperature sensitive devices are contained in the interior space. A cooling plate closes the open side and includes an inner side with a surface that is substantially flat and that faces into the interior. The cooling plate defines a flow channel adjacent the inner side that is configured to channel a circulating fluid to remove heat from the interior space. The flow channel extends across substantially all of the opening. An outer side of the cooling plate may be anodized to block heat from entering the interior space through the cooling plate.

20 Claims, 9 Drawing Sheets

(51) Int. Cl.
*F02C 7/224* (2006.01)
*B64D 27/10* (2006.01)

(56) References Cited

U.S. PATENT DOCUMENTS

| | | | |
|---|---|---|---|
| 6,765,793 B2 | 7/2004 | Kehret et al. | |
| 7,295,440 B2 | 11/2007 | Ganev et al. | |
| 7,523,780 B2* | 4/2009 | Dickey | H01L 23/473 |
| | | | 165/170 |
| 7,729,117 B2 | 6/2010 | Schweinbenz et al. | |
| 8,085,538 B2 | 12/2011 | Noshadi et al. | |
| 8,873,238 B2 | 10/2014 | Wilkins | |
| 9,230,726 B1 | 1/2016 | Parker et al. | |
| 9,386,712 B2 | 7/2016 | Veilleux, Jr. | |
| 9,468,131 B2 | 10/2016 | Brandt et al. | |
| 9,526,191 B2 | 12/2016 | Straznicky et al. | |
| 9,559,508 B2 | 1/2017 | Shepard et al. | |
| 9,736,963 B2 | 8/2017 | Pons et al. | |
| 2005/0219817 A1* | 10/2005 | Suzuki | H05K 7/20927 |
| | | | 361/699 |
| 2007/0045801 A1 | 3/2007 | Sugiyama et al. | |
| 2008/0285230 A1 | 11/2008 | Bojan et al. | |
| 2009/0175718 A1* | 7/2009 | Diaz | F01D 25/12 |
| | | | 415/180 |
| 2012/0080165 A1* | 4/2012 | Pal | H05K 7/20409 |
| | | | 165/51 |
| 2013/0312933 A1 | 11/2013 | Sharaf | |
| 2015/0163962 A1 | 6/2015 | Suzuki et al. | |
| 2016/0029514 A1 | 1/2016 | Alakoc et al. | |
| 2017/0254574 A1* | 9/2017 | Kim | F25B 49/02 |
| 2018/0120912 A1 | 5/2018 | Jenkins et al. | |
| 2018/0124953 A1 | 5/2018 | Engelhardt et al. | |
| 2020/0025081 A1* | 1/2020 | Dyer | F02C 7/236 |

FOREIGN PATENT DOCUMENTS

| | | |
|---|---|---|
| EP | 2640176 A2 | 9/2013 |
| EP | 2702845 A1 | 3/2014 |

* cited by examiner

SYSTEM WITH THIN WALLED COOLING PLATE FOR AN ELECTRONIC ENCLOSURE

TECHNICAL FIELD

Embodiments of the subject matter described herein relate generally to heat management for preventing overheating of temperature sensitive devices such as those in an electronic control unit. More particularly, embodiments of the subject matter relate to systems with thin walled cooling plates for electronic units and that include fluid cooling, shielding, insulating, and simplified construction features.

BACKGROUND

Temperature sensitive devices such as electronic assemblies for transportation applications, machinery or other equipment are often mounted in environments where extreme temperatures are encountered that may have adverse effects on the functionality of the devices. Providing cooling features for electronic units employed in such applications may involve solutions such as radiative fins, or conductive heat exchangers. The known solutions are typically less efficient than needed or have excessive size and weight. For example, cast components are typically heavy and impose constraints on design freedom due to limitations in manufacturing processes. In addition, known solutions for fluid heat exchangers are often complicated to assemble by using multiple components leaving joints that may fail, and/or by requiring brazing or soldering operations.

In an example of gas turbine engine applications, such as those used to power modern commercial aircraft, an electronic unit such as an engine control unit (ECU) may require remote mounting away from areas where high temperatures are commonly encountered because of limitations on available ECU heat protection options. This is because current gas turbine engine combustors generally operate at very high temperatures to achieve high operability, and to produce relatively low levels of gaseous emissions during combustion, and conventional heat management solutions have limitations. Due to needs to reduce size and weight of components, or because of packaging preferences, mounting an ECU remotely is less desirable. Mounting an ECU where shorter harnesses are required, would save weight or provide other advantages, but when doing so involves a hot area, added thermal protection may more than offset any weight savings.

Accordingly, it is desirable to provide light, simple and more effective heat management solutions for temperature sensitive devices such as those found in electronic assemblies. Furthermore, other desirable features and characteristics of the present invention will become apparent from the subsequent detailed description of the invention and the appended claims, taken in conjunction with the accompanying drawings and this background of the invention.

BRIEF SUMMARY

In accordance with an exemplary embodiment, a system includes a thin walled cooling plate for effective cooling. The system includes an enclosure with a cover that defines an interior space and that has an open side. Temperature sensitive devices are contained in the interior space. A cooling plate closes the open side and includes an inner side with a surface that is substantially flat and that faces into the interior. The cooling plate defines a flow channel adjacent the inner side that is configured to channel a circulating fluid to remove heat from the interior space. The flow channel extends across substantially all of the opening.

In accordance with another exemplary embodiment, a system includes an electronic unit with an enclosure that has a cover. The cover defines an interior space and defines an open side. An electronic circuit board is contained in the interior space. A cooling plate closes the open side and includes an inner side that faces into the interior, and an outer side facing away from the interior. The cooling plate defines a flow channel adjacent the inner side that is configured to channel a circulating fluid to remove heat from the interior space. The outer side is anodized to block heat from entering the interior space through the cooling plate In accordance with still another exemplary embodiment, a system includes an engine that has a combustion section. A control unit assembly is mounted to the engine adjacent the combustion section. An enclosure in the control unit assembly includes a cover that defines an interior space and that has an open side. An electronic circuit board is contained in the interior space. A cooling plate closes the open side and includes an inner side that faces into the interior. An outer side is disposed opposite the inner side and faces the engine. The cooling plate defines a flow channel adjacent the inner side. The outer side is anodized and the inner side is not anodized. A fuel system includes the combustion section, the cooling plate, and a fuel pump and metering unit. The fuel pump and metering unit is configured to direct one fuel stream to the combustor and another fuel stream through the cooling plate to the combustor.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

The description contained herein relates to systems in the context of an electronic controller for a gas turbine engine system application, for purposes of demonstrating an example. The features described in the present disclosure that enhance thermal protection of temperature sensitive devices are not limited to any particular type of temperature sensitive device, or to any particular application for those devices, but rather apply wherever thermal protection and management is needed. Accordingly, the teachings of the present disclosure may be applied in a variety of applications with systems where heat management is needed, including with control units for gas turbine engines, when desired.

Exemplary embodiments described herein involve systems with an engine controller that is provided with a cooling via a cooling plate that is advantageously thin walled. The system includes an enclosure with a cover that defines an interior space and that has an open side. Temperature sensitive devices such as circuit boards are contained in the interior space. A cooling plate closes the open side and includes an inner side with a surface that is substantially flat and that faces into the interior. The cooling plate defines a flow channel adjacent the inner side that is configured to channel a circulating fluid to remove heat from the interior space. The flow channel extends across substantially all of the opening. An outer side of the cooling plate may be anodized to block heat from entering the interior space through the cooling plate.

The example system includes fluid cooling, shielding, insulating, and simplified construction features. Fluid cooling is provided by circulating fluid through the cooling plate in close proximity to the interior space as a result of the thin wall. The thin walled nature of the cooling plate allows the circulated fuel to more efficiently draw heat that is generated by the circuit boards contained within the enclosure, while the shielding/insulating reduces the challenge of removing heat emanating from the engine. In the exemplary embodiments, shielding and insulating is provided by anodizing the cooling plate and through a separate shielding/insulating component. Simplified construction is accomplished by using unique additive manufacturing features. As a result, the exemplary embodiments deliver a strategic combination of shielding/insulation and heat exchanging that cools and minimizes the effect of hot engine temperatures from further heating the temperature sensitive devices of a control unit. The exemplary fuel cooling plate is manufactured using additive manufacturing using a self-supporting design that is jointless, and contains an integrated mount system.

Figure 1:
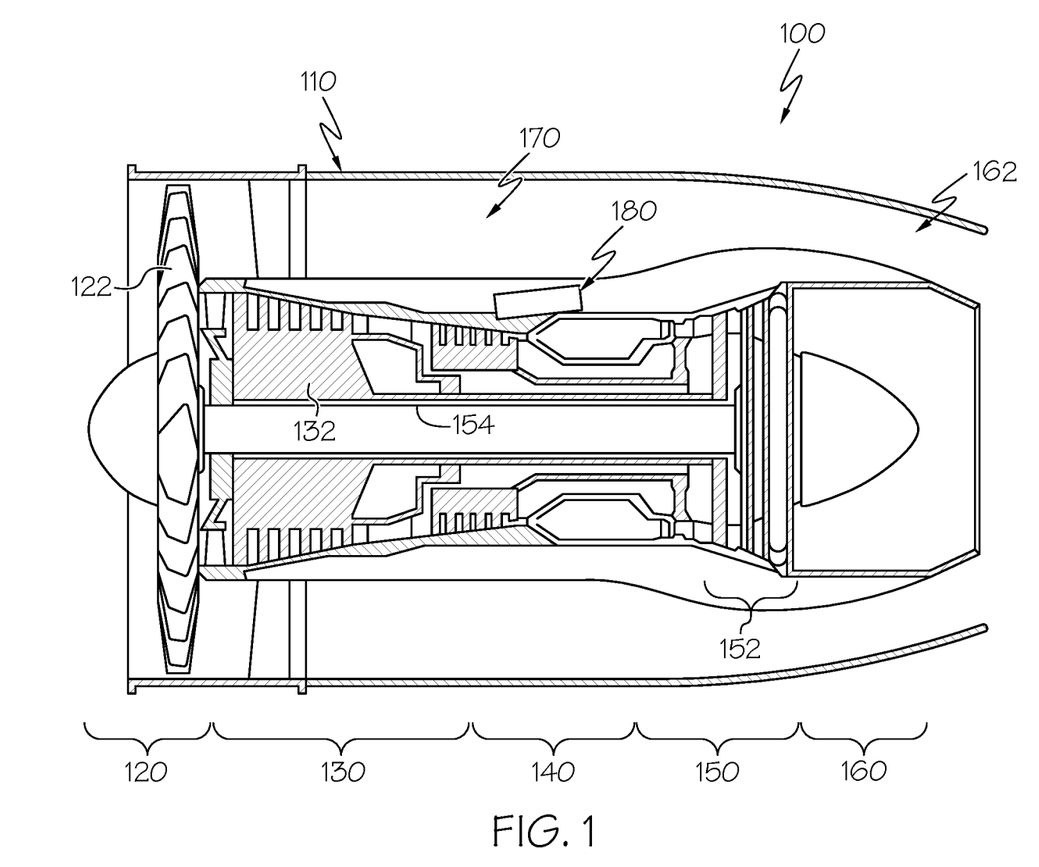
FIG. 1 is a schematic, cross-sectional illustration of a gas turbine engine according to an exemplary embodiment.

FIG. 1 is a simplified, cross-sectional view of a gas turbine engine 100 according to an exemplary embodiment. The engine 100 may be disposed in an engine case 110 and may include a fan section 120, a compressor section 130, a combustion section 140, a turbine section 150, and an exhaust section 160. The fan section 120 may include a fan 122, which draws in and accelerates air. A fraction of the accelerated air exhausted from the fan 122 is directed through a bypass section 170 to provide a forward thrust. The remaining fraction of air exhausted from the fan 122 is directed into the compressor section 130.

The compressor section 130 may include a series of compressors 132 that raise the pressure of the air directed from the fan 122. The compressors 132 then direct the compressed air into the combustion section 140. In the combustion section 140, the high pressure air is mixed with fuel and then combusted. The combusted air is then directed into the turbine section 150. The turbine section 150 may include a series of turbines 152, which may be disposed in axial flow series. The combusted air from a combustor 142 of the combustion section 140 expands through and rotates the turbines 152 prior to being exhausted through a propulsion nozzle 162 disposed in the exhaust section 160. In one embodiment, the turbines 152 rotate to drive equipment in the engine 100 via concentrically disposed shafts or spools. Specifically, the turbines 152 may drive the compressor 132 via one or more rotors 154.

Operation of the engine 100 is at least partially controlled by an ECU assembly 180. The ECU assembly 180 controls various systems of the engine 100 (for example, the fuel system describe further below), and monitors their functions. In addition, the ECU assembly 180 may include modules that control various accessories of the engine 100. Accordingly, the ECU assembly 180 receives a variety of inputs, processes those inputs, and delivers outputs sufficient to operate the engine 100 and any controlled accessories over a wide range of conditions. The inputs are delivered from the engine 100 and other systems of the associated aircraft with which the engine 100 operates. For example, the ECU assembly 180 receives input signals from the flight deck to control engine power. To provide electronic engine control (EEC) functions, the ECU assembly 180 contains various electronic components and circuits, including devices that are temperature sensitive.

The ECU assembly 180 is mounted to the engine 100, in this example in close proximity to the compressor section 130 and the combustion section 140. Hot air is conducted from, and radiates off the engine compressors 132 and the combustor 142, toward the ECU assembly 180. In this example, the ECU assembly 180 contains components that have a design temperature limit of 100 degrees Celsius. Because the environment has excursions above that temperature, the components of the ECU assembly 180 rely on thermal management techniques to ensure they do not overheat. For example, in the current embodiment the ECU assembly 180 is configured with fluid cooling capability, and specifically, with cooling provided by circulating engine fuel through the ECU assembly 180.

Figure 2:
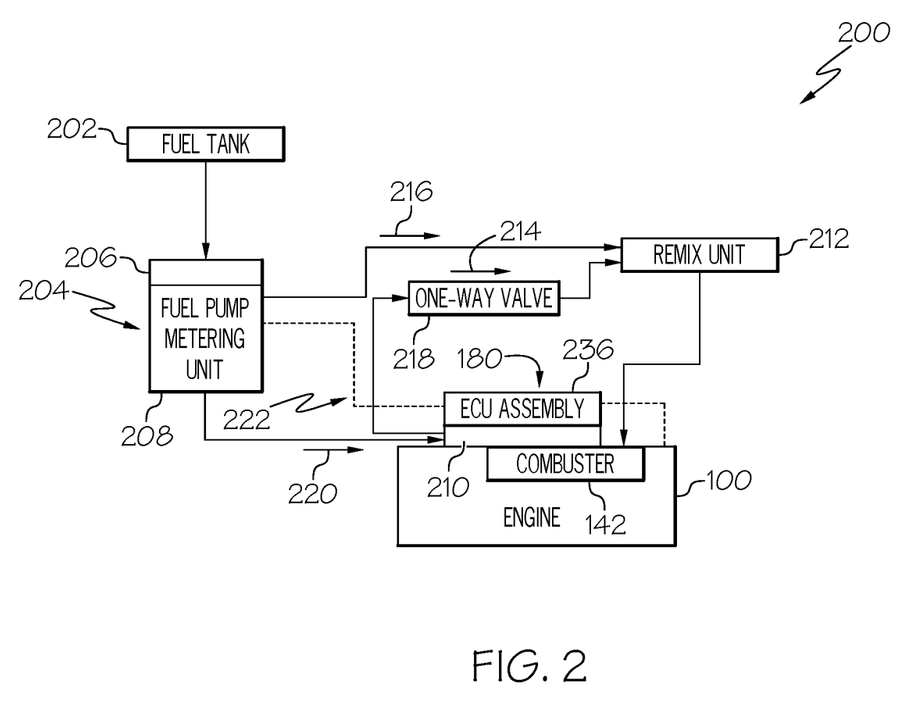
FIG. 2 is a diagram of interrelated systems of the engine of FIG. 1, in accordance with an exemplary embodiment.

Referring to FIG. 2, illustrated is an example of a number of complex interrelated systems of the engine 100 in simplified form. In general, a fuel system 200 includes a fuel tank 202, a fuel pump and metering unit 204, the ECU assembly 180, a remix unit 212, a one-way valve 218, the combustor 142, and connecting fluid conduits. In general, a control system 222 includes an ECU 236, the engine 100, and the fuel pump and metering unit 204. Each of the fuel system 200 and the control system 222 may include a number of additional components and connections as is typical for a gas turbine engine application, which are omitted for purposes of the present description.

Fuel for the engine 100 is stored in a fuel tank 202. In other embodiments, the fuel system 200 may include plural fuel tanks such as on the opposed wings or in various compartments of an aircraft. A fuel pump and metering unit 204 draws fuel from the fuel tank 202 and delivers the right amount of fuel for the operating conditions of the engine 100. The fuel pump and metering unit 204 includes a fuel pump 206 assembled with a fuel metering unit 208, which together operate to supply fuel to injectors of the combustor 142 and to a cooling plate 210 of the ECU assembly 180. In the current embodiment, the ECU assembly 180 digitally controls the fuel pump and metering unit 204, including the fuel pump 206 and the fuel metering unit 208 in response to operator power request inputs and according to preprogrammed performance specifications.

Fuel that is delivered to the ECU assembly 180 for cooling purposes rejoins fuel flowing more directly from the fuel pump and metering unit 204 to the combustor at a remix unit 212, which facilitates rejoining of the cooling fuel flow path 214 with the main fuel flow path 216. A one-way valve 218 is disposed in the cooling fuel flow path 214 between the cooling plate 210 and the remix unit 212. The one-way valve 218 is a type of check valve that ensures flow is only in a direction 220 from the ECU assembly 180 to the remix unit 212 and not from the remix unit 212 to the cooling plate 210. Accordingly, the cooling fuel flow path 214 extends from the fuel tank 202, through the fuel pump and metering unit 204, the cooling plate 210, the one-way valve 218 and the remix unit 212 to the combustor 142. Fuel flows through the main fuel flow path 216 from the fuel tank 202, through the fuel pump and metering unit 204 and the remix unit 212 to the combustor 142. The fuel flowing through the cooling fuel flow path 214 collects heat from the cooling plate 210, cooling the ECU assembly 180 and delivers that heat to the combustor 142 through the main fuel flow path 216.

Figure 3:
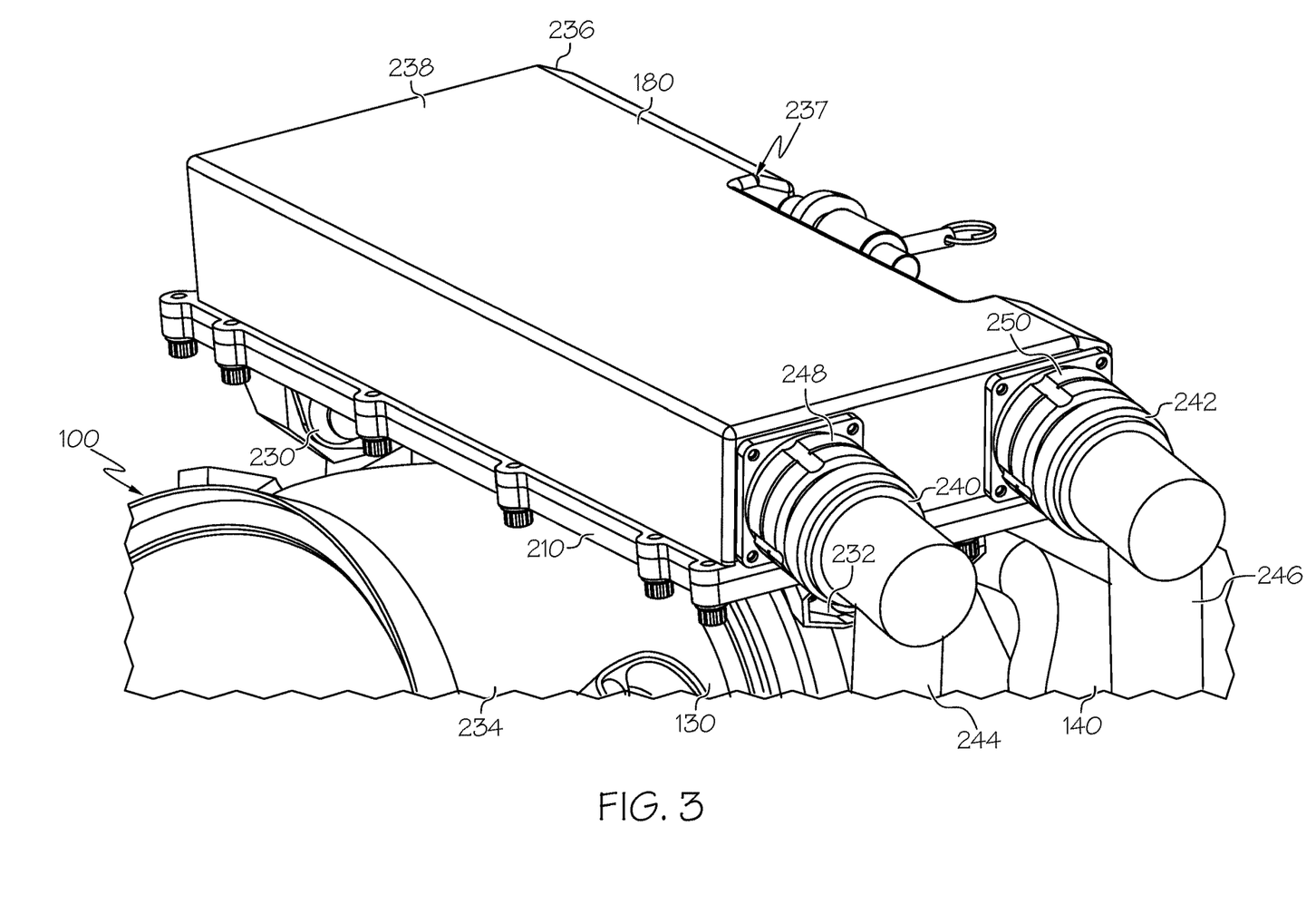
FIG. 3 is a fragmentary isometric illustration of the engine of FIG. 1, in accordance with an exemplary embodiment.

As shown in FIG. 3, the ECU assembly 180 is mounted to the engine 100 by integral mounts 230, 232. In this embodiment, the ECU assembly 180 is core mounted, meaning that it is secured to the core 234 inside the engine case 110 (FIG. 1), at the compressor section 130/combustion section 140. The ECU assembly 180 includes the ECU 236 with an electronics enclosure 237 that includes a cover 238 bolted to the cooling plate 210. In this embodiment, the cover 238 and the cooling plate 210 define a completely enclosed environment for the contained electronics. The ECU assembly 180 is mounted so that the cooling plate 210 is disposed between the ECU 236 and the core 234. Electrical connectors 240, 242 provide a means of releasably connecting wire harnesses 244, 246 to the ECU terminals 248, 250.

Figure 4:
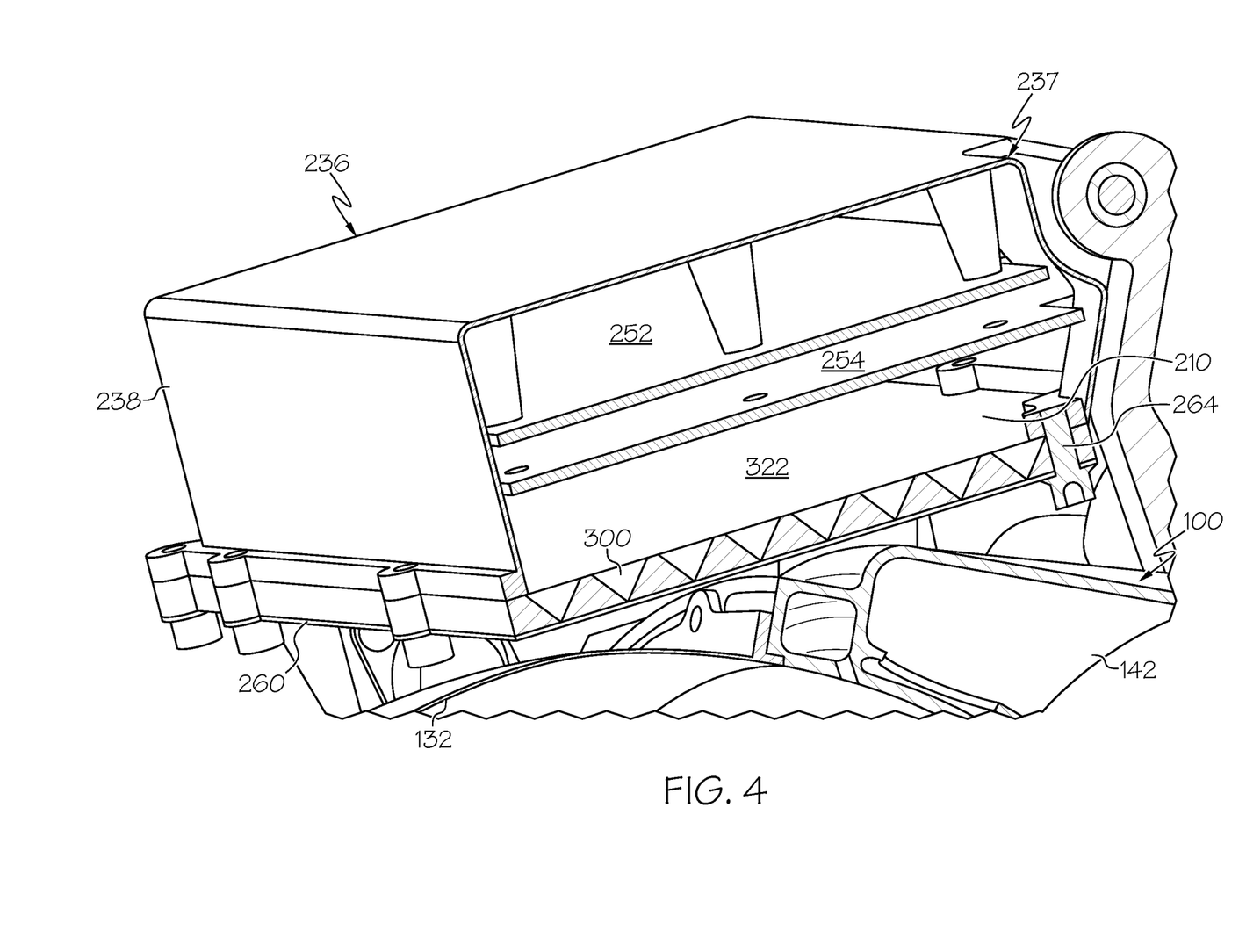
FIG. 4 is a fragmentary, partially sectioned, isometric illustration of the engine of FIG. 1, in accordance with an exemplary embodiment.

A cutaway view is shown in FIG. 4 where it can be seen that the ECU 236 contains electronic devices including circuit boards 252, 254 that are secured in the cover 238. The interior space 256 of the ECU 236 is an enclosed environment bounded on five sides by the cover 238 and on the sixth side by the cooling plate 210. As such, in addition to heat generated internally by the electronic devices, heat emanating from the core 234 to the ECU assembly 180 might become trapped in the interior space 256 causing temperatures to rise as the engine 100 is operated. To manage these heat sources, the cooling plate 210 defines a flow channel 300 for circulating a cooling fluid across substantially all of the interior space 256, and includes features to block heat from the engine 100.

The ECU assembly 180 includes features to manage heat and to allow mounting in the environment around the engine core 234. For example, a heat shield 260 is disposed adjacent to or against the cooling plate 210, and faces the core 234. The heat shield 260 provides a thermal barrier between the ECU assembly 180 and the core 234. The heat shield 260 is composed of radiation blocking material such as stainless steel. In other embodiments, the heat shield 260 is formed from an insulating material such as a fibrous ceramic material and may include a reflective layer, such as of stainless steel, on its side facing the core 234. The heat shield 260 is substantially flat to match the cooling plate 210, with a thickness of less than an inch for example, even when an insulating blanket material is used, and as such is easily formed. The heat shield 260 has a perimetral profile that matches that of the cooling plate 210 and is retained in position by the bolts 264 that hold the cooling plate 210 and the cover 238 together.

Figure 5:
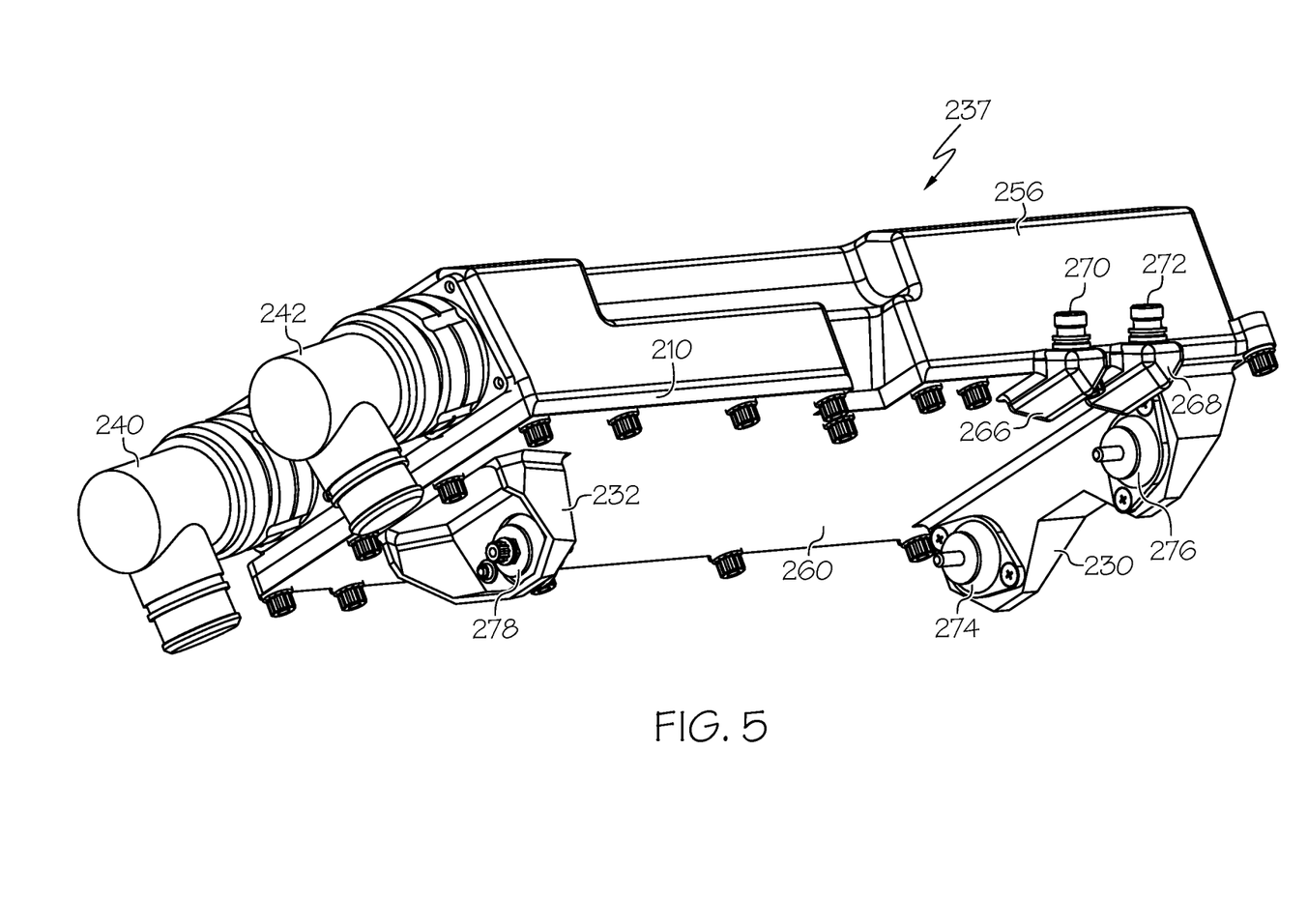
FIG. 5 is an isometric view of an ECU assembly of the engine of FIG. 1, in accordance with an exemplary embodiment.

As shown in FIG. 5, the heat shield 260 has cutouts for the mounts 230, 232, and for port cavity areas 266, 268 which extend from the cooling plate 210 toward the core 234. The cutouts may be created by cutting, forming, or other methods. Fluid connectors 270, 272 are provided on the cooling plate 210 at the port cavity areas 266, 268 respectively, for quick connecting with fluid lines in the fuel system 200 for circulating fuel through the cooling plate 210. The mount 230 includes two isolator assemblies 274, 276 configured to connect the ECU assembly 180 with the engine 100 and the mount 232 includes one such isolator assembly 278. The mounts 230, 232 and the port cavity areas 266, 268 are integrally formed as part of the one-piece cooling plate 210 as further described below.

Figure 6:
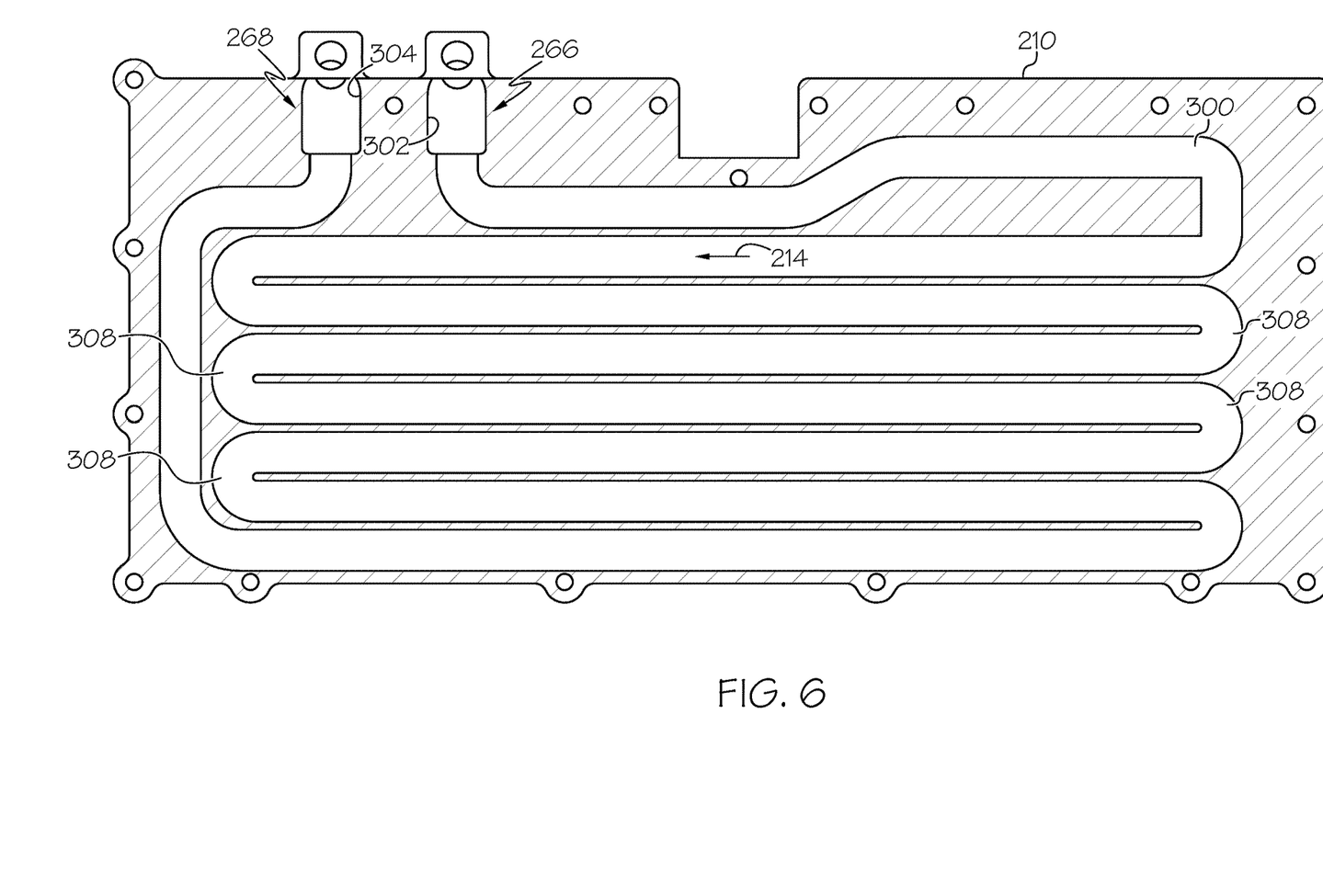
FIG. 6 is sectional illustration through the cooling plate of FIG. 5, in accordance with an exemplary embodiment.

A cross section through the cooling plate 210 is shown in FIG. 6. The flow channel 300 is defined as a single flow channel that extends through the cooling plate 210 from a port cavity 302 in the port cavity area 266 to a port cavity 304 in the port cavity area 268. The flow channel 300 covers substantially all of the area across the cooling plate 210 bounded by the cover 238. The port cavities 302, 304 provide enlarged areas in the cooling fuel flow path 214 for connecting the flow channel 300 with the remainder of the circuit through the fluid connectors 270, 272. The flow channel 300, as defined by the cooling plate 210, has a consistent open cross-sectional area along its length for a simple path with low resistance. The serpentine-like flow channel 300 has smooth transitions 308 with the same open cross-sectional area and long radii for low pressure loss. In addition, the flow channel 300 covers substantially all of the area of the cooling plate 210 to maximize cooling.

Figure 7:
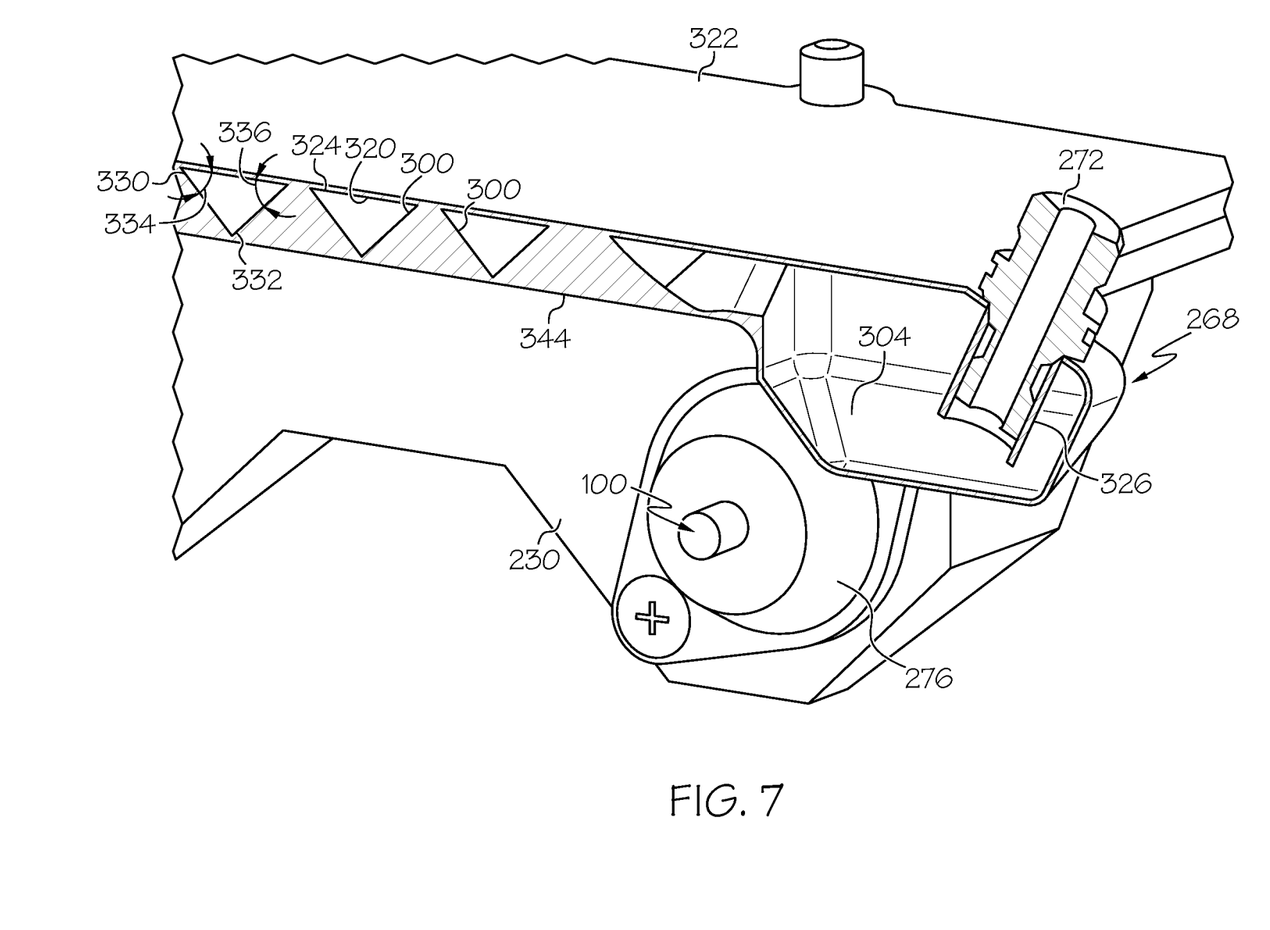
FIG. 7 is fragmentary sectional illustration through the cooling plate of FIG. 5, in accordance with an exemplary embodiment.

A cross section through a portion of the cooling plate 210 at the port cavity 304 is shown in FIG. 7. The flow channel 300 has a triangular cross section with a base wall 320 that is parallel with a surface 322 on an inner side of the cooling plate 210 that is completely flat and that faces into the interior space 256 of the ECU 236 (FIG. 4). In other embodiments, the surface 322 is substantially flat. For example, the areas of the surface 322 over the flow channel 300 are flat so that the flow channel 300 may be maintained at a consistent small dimension below the surface 322 to maximize heat transfer. In some embodiments, the surface 322 may include projections and/or depressions for mounting, clearance, or other purposes. Providing the base wall 320 of the entire flow channel 300 parallel to, and near the surface 322 maximizes heat transfer, and therefore maintaining the surface 322 flat simplifies manufacture. The wall 324 between the flow channel 300 and the interior space 256 is thin, for example 0.005 inch thick in the current embodiment. In other embodiments, the wall 324 may range from 0.005 inches to 0.015 inches in thickness. Providing a wall 324 of this thin dimension is enabled by the methods used to manufacture the cooling plate 210 as further described below. The port cavity 304 has a similarly thin wall which includes an integral cylindrical section 326 that extends into the port cavity 304 and is configured to receive the connector 272. The cross section of the flow channel 300 has side walls 330, 332 adjacent the base wall 320 that are disposed at 45-degree angles 334, 336 relative to the base wall 320 for improved manufacturability as further described below.

Figure 8:
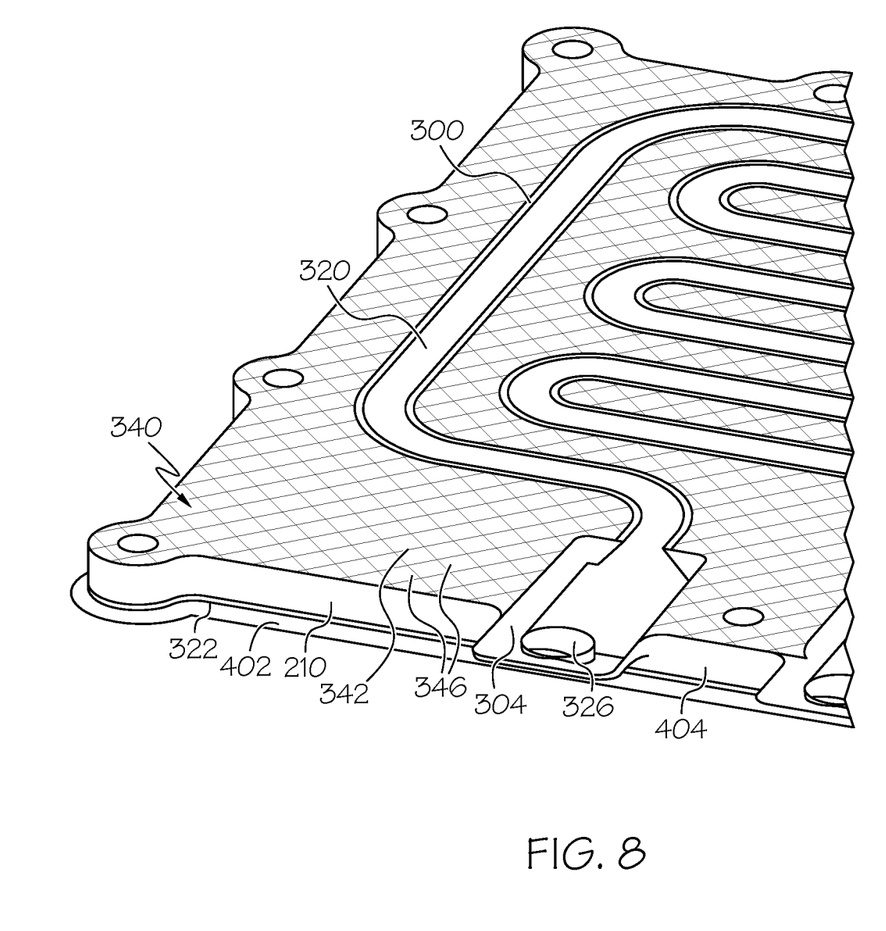
FIG. 8 is a partially completed example of an intermediate stage in the fabrication of the cooling plate of FIG. 5, in accordance with an exemplary embodiment.

The cooling plate 210 is shown in FIG. 8 in a partial state of formation during its creation by additive manufacturing. The cooling plate 210 is built on a base such a build plate 402. The cooling plate 210 is built up by an additive manufacturing process, in this example by direct metal laser sintering (DMLS). DMLS is a type of additive manufacturing/3-D printing that uses a laser to melt and fuse metallic powder grains together to form a component by building up layer upon layer. A variety of alloys or materials may be used and in this embodiment an aluminum alloy is employed.

Initially, the surface 322 is formed on the build plate 402 as a flat feature with a perimeter 404 that defines the cooling plate 210. The flow channel 300, the port cavity 304 and the cylindrical section 326 are built-up as self-supporting features. In the case of the flow channel 300, the base wall 320 is defined first, which enables producing the wall 324 (FIG. 7) of a very thin character. As noted, the wall 324 may be 0.005 inch thick, which is an order of magnitude thinner than could typically be produced by alternate methods such as casting. By forming the angles 334, 336 at 45 degrees, the side walls 330, 332 are built without support being required in the flow channel 300 as it is created. Building the flow channel 300 without internal support provides better flow through the final product without restrictions that would otherwise arise. Building the areas 340 of the cooling plate 210 located away from the flow channel 300 includes forming a latticework of supports 342 for ultimately supporting the surface 344 (FIG. 7) on the outer side of the cooling plate 210. The supports 342 are built by additive manufacturing during production of the cooling plate 210. The supports 342 leave air spaces 346 inside the areas 340, which help reduce heat transfer from the engine 100 toward the ECU 236 (FIG. 4) due to the insulating quality of the trapped air. In some embodiments, the supports 342 are built of a material with lower thermal conductivity than the aluminum alloy of which the balance of the cooling plate 210 is built, such as a polymer or a different alloy to further assist in minimizing heat transfer from the engine 100 to the interior space 256, without inhibiting heat transfer from the interior space 256 to the fuel in the flow channel 300.

With the cooling plate 210 fully formed by DMLS as one continuous piece, it is then removed from the build plate 402 such as by wire electrical-discharge machine cutting, which forms the surface 322. The surface 322, which will be the inner side of the cooling plate 210, may then be machined flat so that a secure seal is achieved with the mating cover 238. The cooling plate 210 is then fastened to the cover 238 and serves as an access panel for servicing internal components of the ECU 236. By means of providing a single openable interface to the interior space 256 at the juncture between the cover 238 and the flat surface 344, improves sealing the interior space 256 and maintaining its sealed integrity. In addition, the cooling plate 210 is formed without the need to connect multiple components such as through brazing or fastening operations which may be used in the manufacture of a conventional heat exchanger. As one piece, the cooling plate with integral mounts 230, 232 is less likely to leak and reduces part proliferation.

In a number of embodiments, the cooling plate 210 is partly anodized. In general, all surfaces of the cooling plate other than the surface 322 of the inner side are anodized. Anodizing is an electrochemical process that leads to an anodic oxidation of the treated surfaces. In the current embodiment, the cooling plate 210 is made of an aluminum alloy, amenable to anodizing. Other nonferrous metals, such as magnesium, titanium and others may be anodized and may be used. The resulting anodic oxidized layer is integrated with the material of the cooling plate 210. The cooling plate 210 may be anodized such as by being immersed in an acid electrolyte solution with an electric current applied through the cooling plate 210. A cathode is mounted in the solution and the aluminum serves as an anode. By the electrochemical process, exposed surfaces are oxidized creating the anodized layer.

Figure 9:
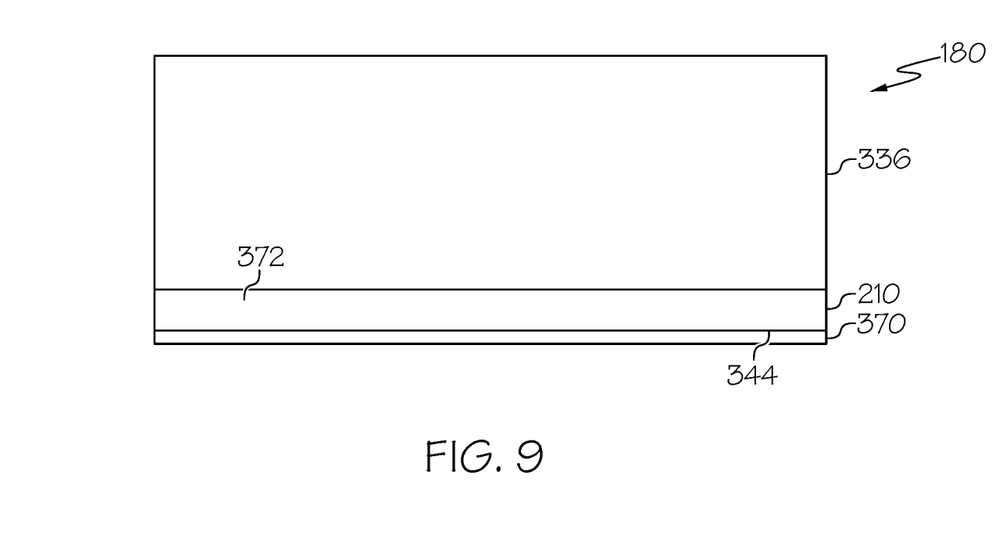
FIG. 9 is a schematic illustration of the ECU assembly of FIG. 5, in accordance with an exemplary embodiment.

Referring to FIG. 9, as shown in schematic form, the ECU 236 is assembled on the cooling plate 210. The surface 344 is anodized forming an anodized layer 370 on the cooling plate 210 facing the core 234. The anodized layer 370 has a lower thermal conductivity characteristic than non-anodized aluminum and assists in reducing heat transfer to the ECU 236. In addition to anodizing the surface 344, the sides 372 of the cooling plate, as well as the surfaces of the mounts 230, 232 and the port cavity areas 266, 268 are anodized to minimize heat transfer into the ECU 236. The surface 322 of the cooling plate facing into the interior space 256 is left free of anodizing to maximize the transfer of heat from the interior space 256 through the cooling plate 210 and into the fuel flowing through the flow channel 300. To simplify anodization, the cooling plate may be anodized while still attached to the build plate 402. The internal surfaces of the flow channel 300 remain non-anodized, so the port cavities 302, 304 are temporarily sealed to prevent anodizing surfaces that touch the fuel. After anodizing, the cooling plate is then removed from the build plate 402, such as by methods described above, and the port cavities 302, 304 are unsealed. This leaves the surface 322 without anodizing. As formed by additive manufacturing and with anodizing, the cooling plate 210 has a thickness of 0.280 inch, which is substantially thinner than could be achieved by other methods such as casting.

Accordingly, exemplary embodiments discussed herein provide a lightweight, low cost, and highly reliable, cooling plate with integrated mounts for ECU applications with limited space, and high temperature environments. Partial anodizing creates a thermal insulator on the cooling plate for all external surfaces while leaving an exposed (non-anodized) surface for the inside of the electronic enclosure. The approach blocks heat from the engine, while allowing the fuel to efficiently cool the internal circuit boards. Additive manufacturing allows thin walls that enable more effective heat exchange. Additive manufacturing also enables creating the cooling plate as a single piece without joints that could otherwise fail such as from high vibrations or repeated heat cycles. A triangular shaped flow channel is self-supporting, so internal details do not require support material that would otherwise impede internal fuel flow. An interface surface between the cooling plate and the enclosure's cover is substantially flat, which is compatible with the additive manufacturing processing. The substantially flat interface surface supports simplified sealing with the cover. The cooling plate includes integrated mount structures which connect directly to the engine. The cooling plate also serves as the access panel for the service opening of the ECU. This eliminates the need for a separate lid while saving cost, weight, and part count. The flat shape of the cooling plate supports a simple design and installation of a separate radiation heat shield.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A system comprising:
an enclosure with a cover defining an interior space and having an open side;
temperature sensitive devices contained in the interior space; and
a cooling plate closing the open side and including an inner side with a surface that is substantially flat and that faces into the interior space, the cooling plate defining a flow channel adjacent the inner side that is configured to channel a circulating fluid to remove heat from the interior space, the flow channel extending across the opening, wherein the cooling plate:
defines an outer side opposite the inner side and facing away from the interior space;
includes areas outside the flow channel with supports extending between the inner side and the outer side; and
defines air spaces between the supports.

2. The system of claim 1, wherein the outer side is anodized to block heat from entering the interior space through the cooling plate and wherein the inner side is non-anodized to facilitate heat transfer between the interior space and the cooling plate.

3. The system of claim 1, wherein the flow channel has a cross section that is triangular in shape with a base that is parallel with the inner side.

4. The system of claim 3, wherein the cooling plate defines, at least in-part, port cavities comprising enlarged areas in the flow channel for connecting the flow channel with a fluid circuit.

5. The system of claim 3, wherein the cross section has a base wall and two side walls each of which is disposed at a forty-five degree angle relative to the base wall and the cross section is self-supporting for formation by additive manufacturing without requiring s any additional support in the flow channel.

6. The system of claim 1, wherein the cooling plate comprises an aluminum alloy with a first thermal conductivity, except that the supports comprise a material with a second thermal conductivity that is lower than the first thermal conductivity.

7. The system of claim 1, wherein the cover comprises a single contiguous piece that defines five sides of the interior space and wherein the cooling plate is configured as an access panel to the interior space.

8. The system of claim 1, comprising:
a gas turbine engine having a compressor section and a combustion section; and
a fuel system configured to supply fuel to the combustion section and to the flow channel;
wherein the cover is disposed adjacent at least one of the compressor section and the combustion section.

9. The system of claim 8, wherein:
the cooling plate includes mounts integral with the cooling plate and is configured to mount the cooling plate to the gas turbine engine; and
the mounts are anodized to block heat from entering the interior space through the cooling plate.

10. The system of claim 1, wherein the outer side is substantially flat, and comprising a heat shield disposed adjacent the outer side, wherein the heat shield is substantially flat.

11. A system comprising:
an electronic unit with an enclosure that has a cover defining an interior space and defining an open side;
an electronic circuit board contained in the interior space; and
a cooling plate closing the open side and including an inner side that faces into the interior and an outer side facing away from the interior space, the cooling plate defining a flow channel adjacent the inner side that is configured to channel a circulating fluid to remove heat from the interior space, wherein the outer side is anodized to block heat from entering the interior space through the cooling plate,
wherein the flow channel has a cross section that is triangular in shape with a base wall that is parallel with the inner side,
wherein the cooling plate includes areas outside the flow channel with supports extending between the inner side and the outer side, and defines air spaces between the supports.

12. The system of claim 11, wherein the flow channel is defined as a single path that extends through the cooling plate.

13. The system of claim 12, wherein the cooling plate comprises an additive manufactured single piece construction.

14. The system of claim 12, wherein the cooling plate comprises an aluminum alloy with a first thermal conductivity, except that the supports comprise a material with a second thermal conductivity that is lower than the first thermal conductivity.

15. The system of claim 12, wherein the cross section has two side walls each of which is disposed at a forty-five degree angle relative to the base wall and the cross section is self-supporting for formation by additive manufacturing without requiring any additional support in the flow channel.

16. The system claim 11, wherein the cover comprises a single contiguous piece that defines five sides of the interior space and wherein the cooling plate is configured as an access panel to the open space.

17. The system of claim 11, comprising:
a gas turbine engine having a compressor section and a combustion section; and
a fuel system configured to supply fuel to the combustion section and to the flow channel;
wherein the cover is disposed adjacent at least one of the compressor section and the combustion section.

18. The system of claim 17, wherein:
the cooling plate includes mounts integral with the cooling plate and configured to mount the cooling plate to the gas turbine engine; and
the mounts are anodized to block heat from entering the interior space through the cooling plate.

19. The system according to claim 11, wherein the base wall is a segment of the cooling plate defined between the first side and the flow channel, wherein the cooling plate at the base wall is less than 0.015 inches thick.

20. A system comprising:
an engine that has a combustion section;
a control unit assembly mounted to the engine adjacent the combustion section;
an enclosure in the control unit assembly with a cover that defines an interior space and that has an open side;
an electronic circuit board contained in the interior space;
a cooling plate closing the open side and including:
an inner side that faces into the interior space;
an outer side opposite the inner side and facing the engine; and
a flow channel in the cooling plate and adjacent the inner side;

wherein the outer side is anodized and the inner side is non-anodized; and a fuel system including:
the combustion section;
the cooling plate; and
a fuel pump metering unit;
wherein the fuel pump metering unit is configured to direct a first fuel stream to the combustion section and a second fuel stream through the cooling plate to the combustor.

\* \* \* \* \*